(12) United States Patent
Huang (10) Patent No.: US 12,490,545 B2
(45) Date of Patent: Dec. 2, 2025

(54) HETEROJUNCTION BATTERY, PREPARATION METHOD THEREFOR, AND APPLICATION THEREOF

(71) Applicant: RISEN ENERGY CO., LTD., Ningbo (CN)

(72) Inventor: Qiang Huang, Ningbo (CN)

(73) Assignee: RISEN ENERGY CO., LTD., Ningbo (CN)

( * ) Notice: Subject to any disclaimer, the term of this patent is extended or adjusted under 35 U.S.C. 154(b) by 261 days.

(21) Appl. No.: 18/127,007

(22) Filed: Mar. 28, 2023

(65) Prior Publication Data
US 2023/0261120 A1    Aug. 17, 2023

Related U.S. Application Data

(63) Continuation of application No. PCT/CN2021/108942, filed on Jul. 28, 2021.

(30) Foreign Application Priority Data

Sep. 29, 2020 (CN) .......................... 202011053423.1

(51) Int. Cl.
*H10F 77/20* (2025.01)
*H10F 10/166* (2025.01)
(Continued)

(52) U.S. Cl.
CPC ......... *H10F 77/211* (2025.01); *H10F 10/166* (2025.01); *H10F 19/906* (2025.01);
(Continued)

(58) Field of Classification Search
CPC .... H10F 10/166; H10F 77/211; H10F 77/707; H10F 71/103; H10F 19/906
See application file for complete search history.

(56) References Cited

U.S. PATENT DOCUMENTS

2008/0121266 A1* 5/2008 Tsunomura ........... H10F 19/908
136/244
2017/0155007 A1* 6/2017 Terashita .............. H10F 19/906
(Continued)

FOREIGN PATENT DOCUMENTS

CN    104037265 A    9/2014
CN    105895746 A    8/2016
(Continued)

OTHER PUBLICATIONS

Machine translation of CN-104037265-A, Ceng X. (Year: 2014).*
(Continued)

*Primary Examiner* — Mayla Gonzalez Ramos (57) ABSTRACT

A heterojunction battery, a preparation method therefor, and an application thereof are provided. The heterojunction battery includes a substrate, a first intrinsic amorphous silicon layer, an N-type doped amorphous silicon layer or microcrystalline silicon layer or nanocrystalline silicon layer, a first transparent conductive oxide layer, a second intrinsic amorphous silicon layer, a P-type doped amorphous silicon layer or microcrystalline silicon layer or nanocrystalline silicon layer, a second transparent conductive oxide layer, and a dielectric film. The heterojunction battery further includes a metal mesh. The metal mesh penetrates through the dielectric film and is fixedly connected to the first transparent conductive oxide layer and the second transparent conductive oxide layer, respectively. The metal mesh is composed of multiple first metal wires and multiple second metal wires. The first metal wires are perpendicular to the second metal wires.

19 Claims, 2 Drawing Sheets

(51) Int. Cl.
*H10F 19/90* (2025.01)
*H10F 71/10* (2025.01)
*H10F 77/42* (2025.01)
*H10F 77/70* (2025.01)

(52) U.S. Cl.
CPC ......... *H10F 71/103* (2025.01); *H10F 77/484* (2025.01); *H10F 77/707* (2025.01)

(56) References Cited

U.S. PATENT DOCUMENTS

2017/0200852 A1* 7/2017 Uto .................. H10F 71/121
2018/0254361 A1 9/2018 Chen et al.

FOREIGN PATENT DOCUMENTS

| CN | 107482071 | A | 12/2017 |
| CN | 208655661 | U | 3/2019 |
| CN | 110649104 | A | 1/2020 |
| CN | 111403554 | A | 7/2020 |
| CN | 112038424 | A | 12/2020 |
| CN | 212625599 | U | 2/2021 |
| WO | WO-2019163786 | A1 * | 8/2019 |

OTHER PUBLICATIONS

Machine translation of CN-105895746-A, Bian J. (Year: 2016).*
Machine translation of CN-107482071-A, Li X. (Year: 2017).*
Machine translation of WO-2019163786-A1, Mishima R. (Year: 2019).*
European search report of EP21874012.4.
International Search Report of PCT/CN2021/108942.
First notice of examination opinions of 202011053423.1.

* cited by examiner

HETEROJUNCTION BATTERY, PREPARATION METHOD THEREFOR, AND APPLICATION THEREOF

CROSS-REFERENCE TO RELATED APPLICATIONS

This application is a continuation of international patent application No. PCT/CN2021/108942, filed on Jul. 28, 2021, which itself claims priority to Chinese patent application No. 202011053423.1, filed on Sep. 29, 2020, and titled "HETEROJUNCTION BATTERY, PREPARATION METHOD THEREFOR, AND APPLICATION THEREOF". The contents of the above identified applications are hereby incorporated herein in their entireties by reference.

TECHNICAL FIELD

The present disclosure relates to the field of solar cell technology, and in particular, to a heterojunction battery, a preparation method therefor, and application thereof.

BACKGROUND

In conventional heterojunction batteries, a resin-type low temperature solidified silver paste is generally used to prepare an electrode. A specific resistance of the electrode is poor, and an electrical conductivity of the electrode is poor. To improve the electrical conductivity of the electrode, a width of the metal electrode or a height of the metal electrode must be increased, which can lead to an increase of silver paste consumption of the battery. A silver paste consumption of a heterojunction battery having a 5BB structure is around 300 mg, which is over 200 mg higher than a PERC battery popular in the market. Even in a latest multiple busbar technology, the silver paste consumption is over 150 mg. Therefore, a cost of the heterojunction battery is high, which occupies over a half of a non-silicon production cost of the battery.

Besides, a material of a transparent conductive oxide layer in the heterojunction battery generally includes indium tin oxide (ITO). Metal indium in the indium tin oxide is a rare metal, which is rare in the earth crust, so that a target used for spurting the indium tin oxide is expensive.

When the heterojunction battery is further prepared to a heterojunction battery assembly, since a temperature for growing the heterojunction battery is under 200 degrees centigrade, a normal solder strip and a normal series welding machine cannot be used. A low temperature solder strip and a low temperature series welding machine is required. The equipment is expensive, thereby further increasing the production cost.

SUMMARY

According to the embodiments of the present disclosure, a heterojunction battery is provided. The heterojunction battery includes: a substrate; a first intrinsic amorphous silicon layer, an N-type doped amorphous silicon layer or microcrystalline silicon layer or nanocrystalline silicon layer, a first transparent conductive oxide layer and a first dielectric film, wherein the first intrinsic amorphous silicon layer, the N-type doped amorphous silicon layer or microcrystalline silicon layer or nanocrystalline silicon layer, the first transparent conductive oxide layer and the first dielectric film are successively stacked on one surface of the substrate; a second intrinsic amorphous silicon layer, a P-type doped amorphous silicon layer or microcrystalline silicon layer or nanocrystalline silicon layer, a second transparent conductive oxide layer and a second dielectric film, wherein the second intrinsic amorphous silicon layer, the P-type doped amorphous silicon layer or microcrystalline silicon layer or nanocrystalline silicon layer, the second transparent conductive oxide layer and the second dielectric film are successively stacked on the other surface of the substrate; a first metal mesh; and, a second metal mesh. The first metal mesh penetrates through the first dielectric film and is fixedly connected to the first transparent conductive oxide layer. The second metal mesh penetrates through the second dielectric film and is fixedly connected to the second transparent conductive oxide layer. Both the first metal mesh and the second metal mesh are consisted of a plurality of first metal wires and a plurality of second metal wires, and the plurality of first metal wires are perpendicular to the plurality of second metal wires.

In the heterojunction battery, since the first metal mesh and the second metal mesh are consisted of the plurality of first metal wires and the plurality of second metal wires, use of expensive resin-type low temperature solidified silver paste can be avoided, which greatly decreases the production cost.

In some embodiments, a material of the plurality of first metal wires is selected from the group consisting of copper, silver, gold, tin, aluminum, and any combination thereof. In some embodiments, a material of the plurality of second metal wires is selected from the group consisting of copper, silver, gold, tin, aluminum, and any combination thereof.

In some embodiments, a diameter of the first metal wire is greater than or equal to a diameter of the second metal wire. The diameter of the first metal wire is in a range of 0.1 millimeters to 10 millimeters, and the diameter of the second metal wire is in a range of 0.1 millimeters to 10 millimeters.

In some embodiments, a shape of a cross section of the plurality of first metal wire is rectangle, square, cylinder, or triangle. In some embodiments, a shape of a cross section of the plurality of second metal wire is rectangle, square, cylinder, or triangle.

In some embodiments, the first metal mesh is fixed with the first transparent conductive oxide layer via a bonding material, and the second metal mesh is fixed with the second transparent conductive oxide layer via another bonding material.

In some embodiments, a material of the bonding material is selected from the group consisting of a conducting resin, a hot melt adhesive, a photosensitive adhesive, a conductive particle-containing nanometer material, and any combination thereof.

In some embodiments, the hot melt adhesive includes polyethylene hot melt adhesive or ethylene copolymer hot melt adhesive.

In some embodiments, a material of the first transparent conductive oxide layer is selected from the group consisting of ITO, IWO, ICO, AZO, FTO, $SnO_2$, and any combination thereof. In some embodiments, a material of the second transparent conductive oxide layer is selected from the group consisting of ITO, IWO, ICO, AZO, FTO, $SnO_2$, and any combination thereof.

In some embodiments, a material of the first dielectric layer is selected from the group consisting of $SiN_x$, SiON, $SiO_x$, $AlO_x$, $MgF_2$, $TiO_2$, and any combination thereof. In some embodiments, a material of the second dielectric layer is selected from the group consisting of $SiN_x$, SiON, $SiO_x$, $AlO_x$, $MgF_2$, or $TiO_2$, and any combination thereof.

In some embodiments, a refractive index of the first transparent conductive oxide layer is greater than a refractive index of the first dielectric film, and a refractive index of the second transparent conductive oxide layer is greater than a refractive index of the second dielectric film.

In some embodiments, a thickness of the first intrinsic amorphous silicon layer is in a range of 1 nanometer to 10 nanometers; a thickness of the N-type doped amorphous silicon layer or microcrystalline silicon layer or nanocrystalline silicon layer is in a range of 1 nanometer to 30 nanometers; a thickness of the first transparent conductive oxide layer is in a range of 1 nanometer to 100 nanometers; and a thickness of the first dielectric film is in a range of 1 nanometer to 100 nanometers.

In some embodiments, a thickness of the second intrinsic amorphous silicon layer is in a range of 1 nanometer to 10 nanometers; a thickness of the P-type doped amorphous silicon layer or microcrystalline silicon layer or nanocrystalline silicon layer is in a range of 1 nanometer to 30 nanometers; a thickness of the second transparent conductive oxide layer is in a range of 1 nanometer to 100 nanometers; and a thickness of the second dielectric film is in a range of 1 nanometer to 100 nanometers.

In some embodiments, the photosensitive adhesive comprises an infrared sensitive adhesive, a visible light sensitive adhesive, UV sensitive adhesive, or X-ray sensitive adhesive.

In some embodiment, the conductive particle comprises metal particles, inorganic particles, conductive organic particles, or conductive organic-inorganic hybridized particles. The metal particles comprises Ag particle or Cu particle, and the inorganic particles comprises graphite particle.

According to the embodiments of the present disclosure, a method for preparing the heterojunction battery described above is provided. The method includes the following steps: subjecting the substrate to a texturing process and obtaining an etched substrate; growing a first intrinsic amorphous silicon layer and an N-type doped amorphous silicon layer or microcrystalline silicon layer or nanocrystalline silicon layer on one surface of the etched substrate, and growing a second intrinsic amorphous silicon layer and a P-type doped amorphous silicon layer or microcrystalline silicon layer or nanocrystalline silicon layer on the other surface of the etched substrate away from the first intrinsic amorphous silicon layer, wherein a temperature during the growing of the first intrinsic amorphous silicon layer and the N-type doped amorphous silicon layer or microcrystalline silicon layer or nanocrystalline silicon layer and the second intrinsic amorphous silicon layer and the P-type doped amorphous silicon layer or microcrystalline silicon layer or nanocrystalline silicon layer is in a range of 100 degrees centigrade to 250 degrees centigrade; depositing a first transparent conductive oxide layer on a surface of the N-type doped amorphous silicon layer or microcrystalline silicon layer or nanocrystalline silicon layer away from the first intrinsic amorphous silicon layer, and depositing a second transparent conductive oxide layer on a surface of the P-type doped amorphous silicon layer or microcrystalline silicon layer or nanocrystalline silicon layer away from the second intrinsic amorphous silicon layer, wherein a temperature during deposition of the first transparent conductive oxide layer and the second transparent conductive oxide layer is in a range of 25 degrees centigrade to 250 degrees centigrade; fixing a first metal mesh on a surface of the first transparent conductive oxide layer away from the N-type doped amorphous silicon layer or microcrystalline silicon layer or nanocrystalline silicon layer, and fixing a second metal mesh on a surface of the second transparent conductive oxide layer away from the P-type doped amorphous silicon layer or microcrystalline silicon layer or nanocrystalline silicon layer; and, depositing a first dielectric film on the surface of the first transparent conductive oxide layer away from the N-type doped amorphous silicon layer or microcrystalline silicon layer or nanocrystalline silicon layer, and depositing a second dielectric film on the surface of the second transparent conductive oxide layer away from the P-type doped amorphous silicon layer or microcrystalline silicon layer or nanocrystalline silicon layer, and obtaining a heterojunction battery, wherein a temperature during deposition of the first dielectric film and the second dielectric film is in a range of 25 degrees centigrade to 250 degrees centigrade.

The method for preparing the heterojunction battery can produce the heterojunction battery with low cost and simple methods, and is suitable for industrial production.

In some embodiments, a method for fixing the first metal mesh and a method for fixing the second metal mesh includes fixing via a bonding material.

According to the embodiments of the present disclosure, a heterojunction battery assembly is provided. The heterojunction battery assembly includes at least two heterojunction batteries described above, or the heterojunction battery prepared by the method described above. The at least two heterojunction batteries are in series connection via an adhesive conductive material, and the at least two heterojunction batteries had the same conversion efficiency.

In the heterojunction battery assembly, since the heterojunction batteries are in series connection via the adhesive conductive material, welding with a solder stripe is not requires, which greatly simplify a preparing process of the heterojunction battery assembly, and lower a production cost. Simplifying of the preparing process can further make it easy to control the production, thereby improving a qualified rate of the product. At the same time, equipment of screen printing, sintering furnace, and the like can be saved, which further lowers an equipment cost.

In some embodiments, the adhesive conductive material is selected from the group consisting of a conductive tape, a conducting resin, a conductive particle-containing nanometer material, and any combination thereof.

BRIEF DESCRIPTION OF THE DRAWINGS

To better describe and illustrate those embodiments and/or examples of the invention disclosed herein, reference may be made to one or more of the accompanying drawings. The additional details or examples used to describe the accompanying drawings should not be considered as limiting the scope of any of the disclosed inventions, the embodiments and/or examples currently described, and the best mode of these inventions as currently understood.

In the figures, 10 represents a substrate; 20 represents a first intrinsic amorphous silicon layer; 30 represents an N-type doped amorphous silicon layer or microcrystalline silicon layer or nanocrystalline silicon layer; 40 represents a second intrinsic amorphous silicon layer; 50 represents a P-type doped amorphous silicon layer or microcrystalline silicon layer or nanocrystalline silicon layer; 60 represents a first transparent conductive oxide layer; 70 represents a second transparent conductive oxide layer; 80 represents a metal mesh; 801 represents a first metal mesh; 802 represents a second metal mesh; 8011 represents a first metal wire; 8012 represents a second metal wire; 90 represents a dielectric film; 901 represents a first dielectric film; 902 represents a second dielectric film; 100 represents a heterojunction battery; 110 represents a conductive material; 120 represents a frame; and 130 represents a heterojunction battery assembly.

DETAILED DESCRIPTION

A heterojunction battery, a method for preparing the heterojunction battery, and application thereof in the present disclosure will be further described hereinafter.

Figure 1:
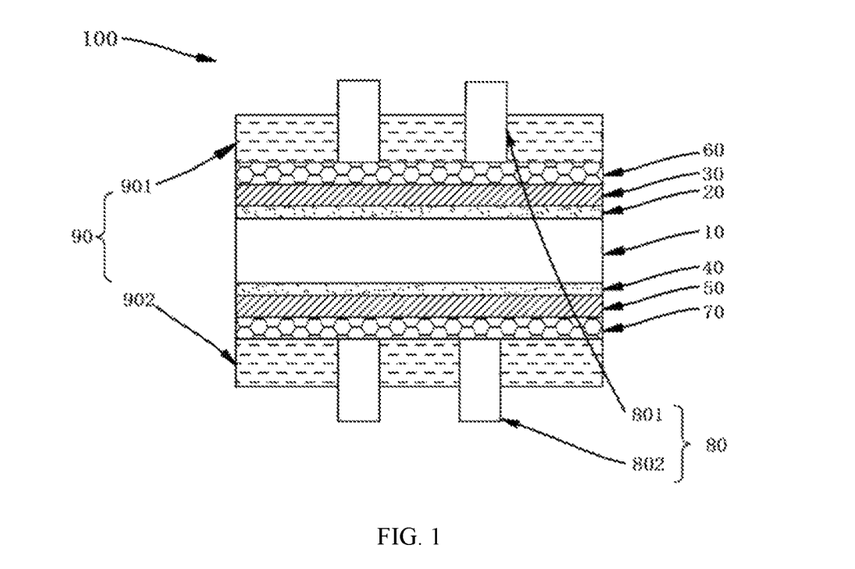
FIG. 1 is a sectional view of a heterojunction battery in an embodiment of the present disclosure.

FIG. 1 is a sectional view of a heterojunction battery 100 in an embodiment of the present disclosure. The heterojunction battery includes a substrate 10, a first intrinsic amorphous silicon layer 20, an N-type doped amorphous silicon layer or microcrystalline silicon layer or nanocrystalline silicon layer 30, a first transparent conductive oxide layer 60, a first dielectric film 901, a second intrinsic amorphous silicon layer 40, a P-type doped amorphous silicon layer or microcrystalline silicon layer or nanocrystalline silicon layer 50, a second transparent conductive oxide layer 70, and second a dielectric film 902. The first intrinsic amorphous silicon layer 20, the N-type doped amorphous silicon layer or microcrystalline silicon layer or nanocrystalline silicon layer 30, the first transparent conductive oxide layer 60 and the first dielectric film 901 are successively stacked on one surface of the substrate 10. The second intrinsic amorphous silicon layer 40, the P-type doped amorphous silicon layer or microcrystalline silicon layer or nanocrystalline silicon layer 50, the second transparent conductive oxide layer 70 and the second dielectric film 902 are successively stacked on the other surface of the substrate 10. The heterojunction battery 100 further includes a first metal mesh 801 and a second metal mesh 802. The first metal mesh 801 penetrates through the first dielectric film 901 and is fixedly connected to the first transparent conductive oxide layer 60. The second metal mesh 802 penetrates through the second dielectric film 902 and is fixedly connected to the second transparent conductive oxide layer 70.

It could be understood that stacking up of the layers can be achieved by processes of depositing or growing. In some embodiments, the intrinsic amorphous silicon layer 20 and the N-type doped amorphous silicon layer or microcrystalline silicon layer or nanocrystalline silicon layer 30 can stack up by a growing process. The second intrinsic amorphous silicon layer 40 and the P-type doped amorphous silicon layer or microcrystalline silicon layer or nanocrystalline silicon layer 50 can stack up by a growing process. The first transparent conductive oxide layer 60 and the first dielectric film 901 can stack up by a depositing process. The second transparent conductive oxide layer 70 and the second dielectric film 902 can stack up by a depositing process.

Figure 2:
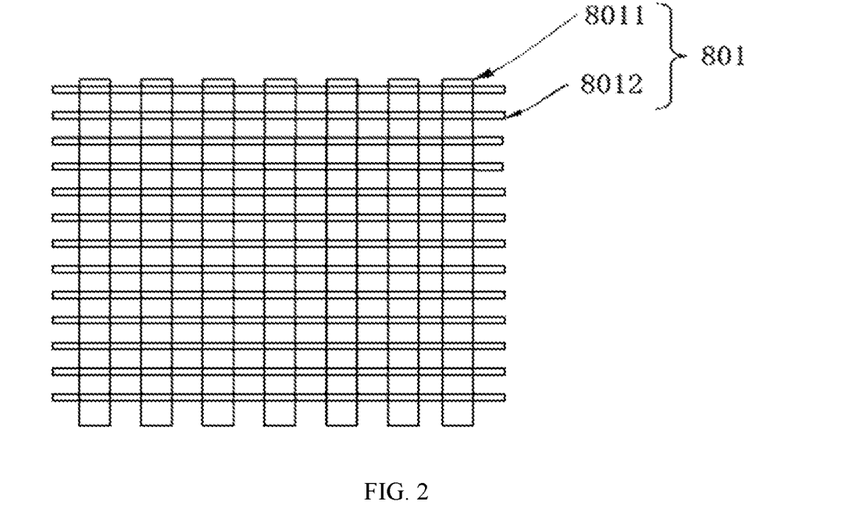
FIG. 2 is a top view of a first metal mesh in an embodiment of the present disclosure.

FIG. 2 is a top view of a first metal mesh 801 in an embodiment of the present disclosure. It could be understood that both the first metal mesh 801 and the second metal mesh 802 are consisted of a plurality of first metal wires 8011 and a plurality of second metal wires 8012, and the plurality of first metal wires 8011 are perpendicular to the plurality of second metal wires 8012.

In some embodiments, the substrate 10 can include a N-type silicon substrate or a P-type silicon substrate.

In some embodiments, a material of the plurality of first metal wires 8011 can be selected from the group consisting of copper, silver, gold, tin, aluminum, and any combination thereof. In some embodiments, a material of the plurality of second metal wires is selected from the group consisting of copper, silver, gold, tin, aluminum, and any combination thereof. The material of the plurality of the first metal wires 8011 and the material of the plurality of second metal wires 8012 can be the same, or not.

In some embodiments, a size of the first metal wire 8011 can be greater than or equal to a size of the second metal wire 8012. The size of the first metal wire 8011 can be in a range of 0.1 millimeters to 10 millimeters. In some embodiments, the size of the first metal wire 8011 can be in a range of 0.1 millimeters to 0.2 millimeters. The size of the second metal wire 8012 can be in a range of 0.1 millimeters to 10 millimeters. In some embodiments, the size of the second metal wire 8012 can be in a range of 0.1 millimeters to 0.15 millimeters. It should be noted that the size of the first metal wire is a diameter of the metal wire.

In some embodiments, a shape of a cross section of the plurality of first metal wires 8011 can be rectangle, square, cylinder, or triangle. In some embodiments, a shape of a cross section of the plurality of second metal wires 8012 can be rectangle, square, cylinder, or triangle. In order to increase a contact area between the metal mesh 80 and the first transparent conductive oxide layer 60 and the second transparent conductive oxide layer 70, and increase the diffuse reflection at the same time, the shape of the sectional view of the plurality of first metal wires 8011 and/or the plurality of second metal wires 8012 can be triangle. It should be noted that the shape of the sectional view of the metal wires is a cross section of the metal wires.

In some embodiments, the first metal mesh 801 can be fixed with the first transparent conductive oxide layer 60 via a bonding material, and the second metal mesh 802 can be fixed with the first transparent conductive oxide layer 60 via another bonding material.

It should be noted that a material of the bonding material can be electrically conductive or not. In some embodiments, a material of the bonding material can be selected from the group consisting of a conducting resin, a hot melt adhesive, a photosensitive adhesive, a conductive particle-containing nanometer material, and any combination thereof.

In some embodiments, the hot melt adhesive can include polyethylene hot melt adhesive or ethylene copolymer hot melt adhesive.

In some embodiments, a material of the first transparent conductive oxide layer 60 can be selected from the group consisting of ITO, IWO, ICO, AZO, FTO, $SnO_2$, and any combination thereof. In some embodiments, a material of the second transparent conductive oxide layer 70 can be selected from the group consisting of ITO, IWO, ICO, AZO, FTO, $SnO_2$, and any combination thereof. In some embodiments, the material of the first transparent conductive oxide layer 60 and/or the second transparent conductive oxide layer 70 can include ITO. A thickness of the first transparent conductive oxide layer 60 can be in a range of 1 millimeter to 100 millimeters, and a thickness of the second transparent conductive oxide layer 70 can be in a range of 1 millimeter to 100 millimeters.

In some embodiments, a material of the first dielectric layer 901 can be selected from the group consisting of $SiN_x$, SiON, $SiO_x$, $AlO_x$, $MgF_2$, $TiO_2$, and any combination thereof. In some embodiments, a material of the second dielectric layer 902 can be selected from the group consisting of $SiN_x$, SiON, $SiO_x$, $AlO_x$, $MgF_2$, or $TiO_2$, and any combination thereof. In some embodiments, the material of the first dielectric film 901 and/or the material of the second dielectric film 902 can include SiN. A thickness of the first dielectric film 901 can be in a range of 1 millimeter to 100 millimeters, and a thickness of the second dielectric film 902 can be in a range of 1 millimeter to 100 millimeters. In some embodiments, the thickness of the first dielectric film 901 can be in a range of 1 millimeter to 70 millimeters, and the thickness of the second dielectric film 902 can be in a range of 1 millimeter to 70 millimeters.

In some embodiments, a refractive index of the first transparent conductive oxide layer 60 can be greater than a refractive index of the first dielectric film 901, and a refractive index of the second transparent conductive oxide layer 70 can be greater than a refractive index of the second dielectric film 902.

It should be noted that when a light vertically enters a medium with a high refractive index from a medium with a low refractive index, interference may occur. The reflected lights may be neutralized, and the transmitted lights are enhanced, that is, the anti-reflection phenomenon. In the heterojunction battery 100 of the present disclosure, the dielectric film 90 and the transparent conductive oxide layer can be stacked up to form an anti-reflection structure to enhance the transmitted light, so that more light can enter the heterojunction battery 100, thereby improving a current density and a conversion efficiency of the heterojunction battery 100 and lowering the thickness of the transparent conductive oxide layer. Thus, the production cost of the heterojunction battery 100 can be further lowered.

In some embodiments, a thickness of the first intrinsic amorphous silicon layer 20 can be in a range of 1 nanometer to 10 nanometers; and a thickness of the N-type doped amorphous silicon layer or microcrystalline silicon layer or nanocrystalline silicon layer 30 can be in a range of 1 nanometer to 30 nanometers.

In some embodiments, a thickness of the second intrinsic amorphous silicon layer 40 can be in a range of 1 nanometer to 10 nanometers; and a thickness of the P-type doped amorphous silicon layer or microcrystalline silicon layer or nanocrystalline silicon layer 50 can be in a range of 1 nanometer to 30 nanometers.

In the heterojunction battery 100 described above, since the first metal mesh 801 and the second metal mesh 802 are consisted of the plurality of first metal wires 8011 and the plurality of second metal wires 8012, use of expensive resin-type low temperature solidified silver paste can be avoided, which greatly decreases the production cost.

A method for preparing the heterojunction battery described above includes the following steps:

S1, subjecting the substrate 10 to a texturing process and obtaining an etched substrate;

S2, growing a first intrinsic amorphous silicon layer 20 and an N-type doped amorphous silicon layer or microcrystalline silicon layer or nanocrystalline silicon layer 30 on one surface of the etched substrate, and growing a second intrinsic amorphous silicon layer 40 and a P-type doped amorphous silicon layer or microcrystalline silicon layer or nanocrystalline silicon layer 50 on the other surface of the etched substrate 10 away from the first intrinsic amorphous silicon layer 20, wherein a temperature during the growing of the first intrinsic amorphous silicon layer 20 and the N-type doped amorphous silicon layer or microcrystalline silicon layer or nanocrystalline silicon layer 30 and the second intrinsic amorphous silicon layer 40 and the P-type doped amorphous silicon layer or microcrystalline silicon layer or nanocrystalline silicon layer 50 is in a range of 100 degrees centigrade to 250 degrees centigrade;

S3, depositing a first transparent conductive oxide layer 60 on a surface of the N-type doped amorphous silicon layer or microcrystalline silicon layer or nanocrystalline silicon layer 30 away from the first intrinsic amorphous silicon layer 20, and depositing a second transparent conductive oxide layer 70 on a surface of the P-type doped amorphous silicon layer or microcrystalline silicon layer or nanocrystalline silicon layer 50 away from the second intrinsic amorphous silicon layer 40, wherein a temperature during deposition of the first transparent conductive oxide layer 60 and the second transparent conductive oxide layer 70 is in a range of 25 degrees centigrade to 250 degrees centigrade;

S4, fixing a first metal mesh 801 on a surface of the first transparent conductive oxide layer 60 away from the N-type doped amorphous silicon layer or microcrystalline silicon layer or nanocrystalline silicon layer 30, and fixing a second metal mesh 802 on a surface of the second transparent conductive oxide layer 70 away from the P-type doped amorphous silicon layer or microcrystalline silicon layer or nanocrystalline silicon layer 50; and, S5, depositing a first dielectric film 901 on the surface of the first transparent conductive oxide layer 60 away from the N-type doped amorphous silicon layer or microcrystalline silicon layer or nanocrystalline silicon layer 30, and depositing a second dielectric film 902 on the surface of the second transparent conductive oxide layer 70 away from the P-type doped amorphous silicon layer or microcrystalline silicon layer or nanocrystalline silicon layer 50, and obtaining a heterojunction battery, wherein a temperature of during deposition of the first dielectric film 901 and the second dielectric film 902 is in a range of 25 degrees centigrade to 250 degrees centigrade.

In some embodiments, step S1 can include: subjecting the substrate 10 to the texturing process with an alkaline solution and obtaining the etched substrate. In some embodiments, the alkaline solution can include NaOH solution or KOH solution.

In some embodiments, step S2 can apply plasma enhanced chemical vapor deposition equipment.

In step S3, the method for depositing the first transparent conductive oxide layer 60 and the second transparent conductive oxide layer 70 can include magnetron sputtering deposition, reactive plasma deposition or electron beam evaporation deposition.

In some embodiments, the temperature during deposition of the first transparent conductive oxide layer 60 and the second transparent conductive oxide layer 70 can be in a range of 25 degrees centigrade to 250 degrees centigrade.

In step S4, a method for fixing the first metal mesh 801 and a method for fixing the second metal mesh 802 both include fixing via a bonding material. In some embodiments, a surface of the first metal mesh 801 and a surface of the second metal mesh 802 can be coated with a material of the bonding material; a surface of the first transparent conductive oxide layer 60 can be fixed with the surface of the first metal mesh 801 coated with the material of the bonding material, and a surface of the second transparent conductive oxide layer 70 can be fixed with the surface of the second metal mesh 802 coated with the material of the bonding material.

In step S5, a method for depositing the first dielectric film 901 and a method for depositing the second dielectric film 902 can include plasma enhanced chemical vapor deposition or atomic layer deposition. In some embodiments, the temperature during deposition of the first dielectric film 901 and the second dielectric film 902 can be in a range of 100 degrees centigrade to 250 degrees centigrade.

It could be understood that in the process of preparing the first dielectric film 901 and the second dielectric film 902, a contact area between the first metal mesh 801 and the first transparent conductive oxide layer 60 and a contact area between the second metal mesh 802 and the second transparent conductive oxide layer 70 are subjected to a annealing treatment, so that a doping concentration on the surface of the first transparent conductive oxide layer 60 and the second transparent conductive oxide layer 70 can be improved. At the same time, a certain temperature of the annealing treatment can improve a bonding strength between the first metal mesh 801 and the first transparent conductive oxide layer 60 and a bonding strength between the second metal mesh 802 and the second transparent conductive oxide layer, thereby forming a good contact.

The method for preparing the heterojunction battery can produce the heterojunction battery 100 with low cost and simple methods, and is suitable for industrial production.

Figure 3:
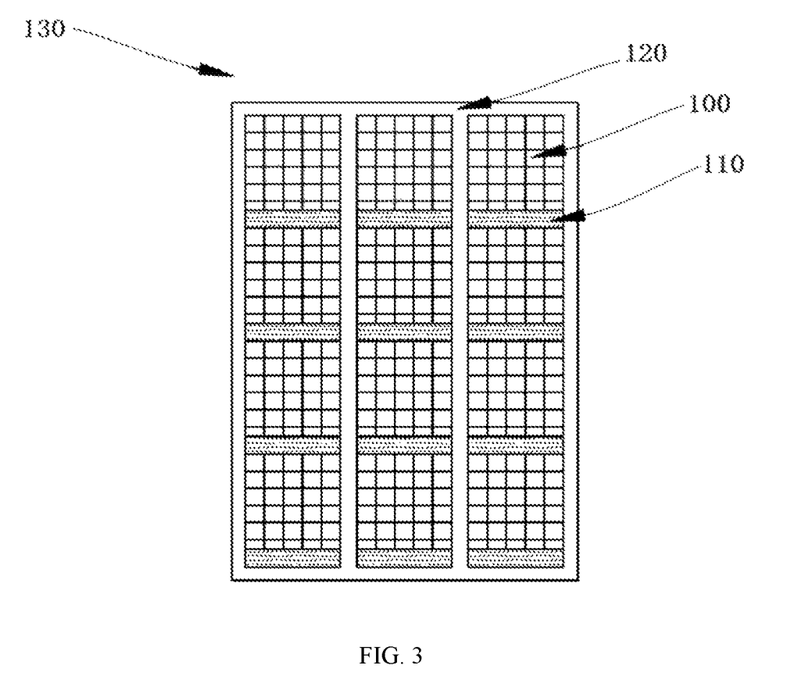
FIG. 3 is a structural schematic diagram of a heterojunction battery assembly in an embodiment of the present disclosure.

The heterojunction battery assembly 130 includes at least two heterojunction batteries 100 described above, or the heterojunction battery 100 prepared by the method described above. The at least two heterojunction batteries 100 are in series connection via an adhesive conductive material 110, and the at least two heterojunction batteries had the same conversion efficiency.

In some embodiments, the conversion efficiency of the heterojunction battery 100 can be tested with a cooper test stand. Both sides of the copper test stand can be equipped with a plurality of metal wires, which can play a role of a conventional probe row and be used to test a battery without a main grid.

In some embodiments, the adhesive conductive material 110 can be selected from the group consisting of a conductive tape, a conducting resin, a conductive particle-containing nanometer material, and any combination thereof.

In the heterojunction battery assembly 130, since the heterojunction batteries 100 are in series connection via the adhesive conductive material 110, welding with a solder stripe is not required, which greatly simplifies a preparing process of the heterojunction battery assembly 130, and lowers a production cost. Simplifying of the preparing process can further make it easy to control the production, thereby improving a qualified rate of the product. At the same time, equipment of screen printing, sintering furnace, and the like can be saved, which further lowers an equipment cost.

The heterojunction battery, the method for preparing the same and the application thereof will be further described in conjunction with the embodiments hereinafter.

First Embodiment

A substrate 10 was subjected to a texturing process with NaOH solution, and the substrate 10 was an N-type silicon substrate.

A first intrinsic amorphous silicon layer 20 having a thickness of 5 nanometers and an N-type doped amorphous silicon layer or microcrystalline silicon layer or nanocrystalline silicon layer 30 having a thickness of 15 nanometers were grown on the etched substrate 10 with plasma enhanced chemical vapor deposition equipment (PECVD). A second intrinsic amorphous silicon layer 40 having a thickness of 5 nanometers and a P-type doped amorphous silicon layer or microcrystalline silicon layer or nanocrystalline silicon layer 50 having a thickness of 15 nanometers were grown on the other surface of the etched substrate away from the first intrinsic amorphous silicon layer 20. A temperature of a growing process of the first intrinsic amorphous silicon layer 20 and the N-type doped amorphous silicon layer or microcrystalline silicon layer or nanocrystalline silicon layer 30 and the second intrinsic amorphous silicon layer 40 and the P-type doped amorphous silicon layer or microcrystalline silicon layer or nanocrystalline silicon layer 50 is 200 degrees centigrade.

A first transparent conductive oxide layer 60 having a thickness of 50 nanometers was deposited on a surface of the N-type doped amorphous silicon layer or microcrystalline silicon layer or nanocrystalline silicon layer 30 away from the first intrinsic amorphous silicon layer 20, and a second transparent conductive oxide layer 70 having a thickness of 50 nanometers was deposited on a surface of the P-type doped amorphous silicon layer or microcrystalline silicon layer or nanocrystalline silicon layer 50 away from the second intrinsic amorphous silicon layer 40 by method of active plasma deposition. A temperature during a growing process of the first transparent conductive oxide layer 60 and the second transparent conductive oxide layer 70 was 100 degrees centigrade, and a material of the first transparent conductive oxide layer 60 and the second transparent conductive oxide layer 70 was ITO.

A first metal mesh 801 was fixed on a surface of the first transparent conductive oxide layer 60 away from the N-type doped amorphous silicon layer or microcrystalline silicon layer or nanocrystalline silicon layer 30 as an electrode by a conducting resin. A second metal mesh 802 was fixed on a surface of the second transparent conductive oxide layer 70 away from the P-type doped amorphous silicon layer or microcrystalline silicon layer or nanocrystalline silicon layer 50 as an electrode by a conducting resin. Both the first metal mesh 801 and the second metal mesh 802 were consisted of a plurality of first metal wires 8011 and a plurality of second metal wires 8012, and the plurality of first metal wires 8011 were perpendicular to the plurality of second metal wires 8012. A diameter of the first metal wire 8011 was 0.2 millimeters, and a shape of a cross section of the first metal wire 8011 was triangle. A diameter of the second metal wire 8012 was 0.15 millimeters, and a shape of a cross section of the second metal wire 8012 was triangle.

A first dielectric film 901 having a thickness of 40 nanometers was deposited on a surface of the first transparent conductive oxide layer 60 away from the N-type doped amorphous silicon layer or microcrystalline silicon layer or nanocrystalline silicon layer 30, and a second dielectric film 902 having a thickness of 40 nanometers was deposited on a surface of the second transparent conductive oxide layer 70 away from the P-type doped amorphous silicon layer or microcrystalline silicon layer or nanocrystalline silicon layer 50 by plasma enhanced chemical vapor deposition, so as to obtain a heterojunction battery 100. A temperature during a growing process of the first dielectric film 901 and the second dielectric film 902 was 200 degrees centigrade. A material of the first dielectric film 901 and the second dielectric film 902 included $SiN_x$. Therefore, an $ITO/SiN_x$ stack-up anti-reflection structure was formed outside an area of the first metal mesh 801 and an area of the second metal mesh 802.

The heterojunction battery 100 was subjected to an electrical performance test and sorting with a tuft method used for testing batteries without main girds. Twelve heterojunction batteries 100 having the same conversion efficiency were chosen. Both ends of the heterojunction batteries 100 were pasted with the conducting resin to connect a positive electrode and a negative electrode (that is, the metal mesh 80) of adjacent two heterojunction batteries 100, so that the heterojunction batteries 100 were in series connection. The heterojunction batteries 100 were then arranged, provided with an ethylene-vinyl acetate copolymer (EVA) film, subjected to lamination and gluing, and provided with a frame 120 to obtain the heterojunction battery assembly 130 shown in FIG. 3.

Second Embodiment

A substrate 10 was subjected to a texturing process with NaOH solution, and the substrate 10 was an N-type silicon substrate.

A first intrinsic amorphous silicon layer 20 having a thickness of 8 nanometers and an N-type doped amorphous silicon layer or microcrystalline silicon layer or nanocrystalline silicon layer 30 having a thickness of 25 nanometers were grown on the etched substrate 10 with plasma enhanced chemical vapor deposition equipment (PECVD). A second intrinsic amorphous silicon layer 40 having a thickness of 8 nanometers and a P-type doped amorphous silicon layer or microcrystalline silicon layer or nanocrystalline silicon layer 50 having a thickness of 25 nanometers were grown on the other surface of the etched substrate away from the first intrinsic amorphous silicon layer 20. A temperature during a growing process of the first intrinsic amorphous silicon layer 20 and the N-type doped amorphous silicon layer or microcrystalline silicon layer or nanocrystalline silicon layer 30 and the second intrinsic amorphous silicon layer 40 and the P-type doped amorphous silicon layer or microcrystalline silicon layer or nanocrystalline silicon layer 50 was 100 degrees centigrade.

A first transparent conductive oxide layer 60 having a thickness of 80 nanometers was deposited on a surface of the N-type doped amorphous silicon layer or microcrystalline silicon layer or nanocrystalline silicon layer 30 away from the first intrinsic amorphous silicon layer 20, and a second transparent conductive oxide layer 70 having a thickness of 80 nanometers was deposited on a surface of the P-type doped amorphous silicon layer or microcrystalline silicon layer or nanocrystalline silicon layer 50 away from the second intrinsic amorphous silicon layer 40 by method of electron beam evaporation deposition. Both a temperature during a growing process of the first transparent conductive oxide layer 60 and the second transparent conductive oxide layer 70 was 25 degrees centigrade, and both a material of the first transparent conductive oxide layer 60 and the second transparent conductive oxide layer 70 was ITO.

A first metal mesh 801 was fixed on a surface of the first transparent conductive oxide layer 60 away from the N-type doped amorphous silicon layer or microcrystalline silicon layer or nanocrystalline silicon layer 30 as an electrode by a polyethylene hot melt adhesive. A second metal mesh 802 was fixed on a surface of the second transparent conductive oxide layer 70 away from the P-type doped amorphous silicon layer or microcrystalline silicon layer or nanocrystalline silicon layer 50 as an electrode by a polyethylene hot melt adhesive. Both the first metal mesh 801 and the second metal mesh 802 were consisted of a plurality of first metal wires 8011 and a plurality of second metal wires 8012. The plurality of first metal wires 8011 were perpendicular to the plurality of second metal wires 8012. A diameter of the first metal wire 8011 was 0.15 millimeters, and a shape of a cross section of the first metal wire 8011 was round. A diameter of the second metal wire 8012 was 0.15 millimeters, and a shape of a cross section of the second metal wire 8012 was round.

A first dielectric film 901 having a thickness of 60 nanometers was deposited on a surface of the first transparent conductive oxide layer 60 away from the N-type doped amorphous silicon layer or microcrystalline silicon layer or nanocrystalline silicon layer 30, and a second dielectric film 902 having a thickness of 60 nanometers was deposited on a surface of the second transparent conductive oxide layer 70 away from the P-type doped amorphous silicon layer or microcrystalline silicon layer or nanocrystalline silicon layer 50 by atomic layer deposition, so as to obtain a heterojunction battery 100. A temperature of a growing process of the first dielectric film 901 and the second dielectric film 902 was 150 degrees centigrade. A material of the first dielectric film 901 and the second dielectric film 902 included $TiO_2$. Therefore, an ITO/$TiO_2$ stack-up anti-reflection structure was formed outside an area of the first metal mesh 801 and an area of the second metal mesh 802.

The heterojunction battery 100 was subjected to an electrical performance test and sorting with a tuft method used for testing batteries without main girds. Twelve heterojunction batteries 100 having the same conversion efficiency were chosen. Both ends of the heterojunction batteries 100 were pasted with the Ag particle-containing nanometer material to connect a positive electrode and a negative electrode (that is, the metal mesh 80) of adjacent two heterojunction batteries 100, so that the heterojunction batteries 100 were in series connection. Then, the heterojunction batteries 100 were arranged, provided with an ethylene-vinyl acetate copolymer (EVA) film, subjected to lamination and gluing, and provided with a frame 120 to obtain the heterojunction battery assembly 130 shown in FIG. 3.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:
1. A heterojunction battery, comprising
a substrate;
a first intrinsic amorphous silicon layer, an N-type doped amorphous silicon layer or microcrystalline silicon layer or nanocrystalline silicon layer, a first transparent conductive oxide layer and a first dielectric film, wherein the first intrinsic amorphous silicon layer, the N-type doped amorphous silicon layer or microcrystalline silicon layer or nanocrystalline silicon layer, the first transparent conductive oxide layer and the first dielectric film are successively stacked on one surface of the substrate;

a second intrinsic amorphous silicon layer, a P-type doped amorphous silicon layer or microcrystalline silicon layer or nanocrystalline silicon layer, a second transparent conductive oxide layer and a second dielectric film, wherein the second intrinsic amorphous silicon layer, the P-type doped amorphous silicon layer or microcrystalline silicon layer or nanocrystalline silicon layer, the second transparent conductive oxide layer and the second dielectric film are successively stacked on the other surface of the substrate;

a first metal mesh; and, a second metal mesh, wherein the first metal mesh penetrates through the first dielectric film and is fixedly connected to the first transparent conductive oxide layer, and a surface of the first metal mesh is uncoated and free from the first dielectric film; the second metal mesh penetrates through the second dielectric film and is fixedly connected to the second transparent conductive oxide layer, and a surface of the second metal mesh is uncoated and free from the second dielectric film;

both the first metal mesh and the second metal mesh are consisted of a plurality of first metal wires and a plurality of second metal wires, and the plurality of first metal wires are perpendicular to the plurality of second metal wires, a size of the plurality of first metal wires is greater than or equal to a size of the plurality of the second metal wires.

2. The heterojunction battery of claim 1, wherein a material of the plurality of first metal wires is selected from the group consisting of copper, silver, gold, tin, aluminum, and any combination thereof, and/or, a material of the plurality of second metal wires is selected from the group consisting of copper, silver, gold, tin, aluminum, and any combination thereof.

3. The heterojunction battery of claim 1, wherein a diameter of the first metal wire is greater than or equal to a diameter of the second metal wire; and the diameter of the first metal wire is in a range of 0.1 millimeters to 10 millimeters, and the diameter of the second metal wire is in a range of 0.1 millimeters to 10 millimeters.

4. The heterojunction battery of claim 1, wherein a shape of a cross section of the plurality of first metal wire is rectangle, square, cylinder, or triangle, and/or, a shape of a cross section of the plurality of second metal wire is rectangle, square, cylinder, or triangle.

5. The heterojunction battery of claim 1, wherein the first metal mesh is fixed with the first transparent conductive oxide layer via a bonding material, and the second metal mesh is fixed with the second transparent conductive oxide layer via another bonding material.

6. The heterojunction battery of claim 5, wherein a material of the bonding material is selected from the group consisting of a conducting resin, a hot melt adhesive, a photosensitive adhesive, a conductive particle-containing nanometer material, and any combination thereof.

7. The heterojunction battery of claim 6, wherein the hot melt adhesive comprises polyethylene hot melt adhesive or ethylene copolymer hot melt adhesive; and/or, the photosensitive adhesive comprises an infrared sensitive adhesive, a visible light sensitive adhesive, UV sensitive adhesive, or X-ray sensitive adhesive; and/or, the conductive particle comprises metal particles, inorganic particles, conductive organic particles, or conductive organic-inorganic hybridized particles, the metal particles comprises Ag particle or Cu particle, and the inorganic particles comprises graphite particle.

8. The heterojunction battery of claim 1, wherein a material of the first transparent conductive oxide layer is selected from the group consisting of ITO, IWO, ICO, AZO, FTO, $SnO_2$, and any combination thereof; and/or, a material of the second transparent conductive oxide layer is selected from the group consisting of ITO, IWO, ICO, AZO, FTO, $SnO_2$, and any combination thereof.

9. The heterojunction battery of claim 1, wherein a material of the first dielectric layer is selected from the group consisting of $SiN_x$, SiON, $SiO_x$, AlOx, $MgF_2$, $TiO_2$, and any combination thereof; and/or, a material of the second dielectric layer is selected from the group consisting of SiN, $SiO_x$, $AlO_x$, $MgF_2$, or $TiO_2$, and any combination thereof.

10. The heterojunction battery of claim 8, wherein a refractive index of the first transparent conductive oxide layer is greater than a refractive index of the first dielectric film, and a refractive index of the second transparent conductive oxide layer is greater than a refractive index of the second dielectric film.

11. The heterojunction battery of claim 9, wherein a refractive index of the first transparent conductive oxide layer is greater than a refractive index of the first dielectric film, and a refractive index of the second transparent conductive oxide layer is greater than a refractive index of the second dielectric film.

12. The heterojunction battery of claim 1, wherein a thickness of the first intrinsic amorphous silicon layer is in a range of 1 nanometer to 10 nanometers; a thickness of the N-type doped amorphous silicon layer or microcrystalline silicon layer or nanocrystalline silicon layer is in a range of 1 nanometer to 30 nanometers; a thickness of the first transparent conductive oxide layer is in a range of 1 nanometer to 100 nanometers; and a thickness of the first dielectric film is in a range of 1 nanometer to 100 nanometers.

13. The heterojunction battery of claim 1, wherein a thickness of the second intrinsic amorphous silicon layer is in a range of 1 nanometer to 10 nanometers; a thickness of the P-type doped amorphous silicon layer or microcrystalline silicon layer or nanocrystalline silicon layer is in a range of 1 nanometer to 50 nanometers; a thickness of the second transparent conductive oxide layer is in a range of 1 nanometer to 100 nanometers; and, a thickness of the second dielectric film is in a range of 1 nanometer to 100 nanometers.

14. A method for preparing the heterojunction battery of claim 1, comprising, subjecting the substrate to a texturing process and obtaining an etched substrate;

growing a first intrinsic amorphous silicon layer and an N-type doped amorphous silicon layer or microcrystalline silicon layer or nanocrystalline silicon layer on one surface of the etched substrate, and growing a second intrinsic amorphous silicon layer and a P-type doped amorphous silicon layer or microcrystalline silicon layer or nanocrystalline silicon layer on the other surface of the etched substrate away from the first intrinsic amorphous silicon layer, wherein a temperature during the growing of the first intrinsic amorphous silicon layer and the N-type doped amorphous silicon layer or microcrystalline silicon layer or nanocrystalline silicon layer and the growing of the second intrinsic amorphous silicon layer and the P-type doped amorphous silicon layer or microcrystalline silicon layer or nanocrystalline silicon layer is in a range of 100 degrees centigrade to 250 degrees centigrade;

depositing a first transparent conductive oxide layer on a surface of the N-type doped amorphous silicon layer or microcrystalline silicon layer or nanocrystalline silicon layer away from the first intrinsic amorphous silicon layer, and depositing a second transparent conductive oxide layer on a surface of the P-type doped amorphous silicon layer or microcrystalline silicon layer or nanocrystalline silicon layer away from the second intrinsic amorphous silicon layer, wherein a temperature during the deposition of the first transparent conductive oxide layer and the second transparent conductive oxide layer are in a range of 25 degrees centigrade to 250 degrees centigrade;

fixing a first metal mesh on a surface of the first transparent conductive oxide layer away from the N-type doped amorphous silicon layer or microcrystalline silicon layer or nanocrystalline silicon layer, and fixing a second metal mesh on a surface of the second transparent conductive oxide layer away from the P-type doped amorphous silicon layer or microcrystalline silicon layer or nanocrystalline silicon layer; and, depositing a first dielectric film on the surface of the first transparent conductive oxide layer away from the N-type doped amorphous silicon layer or microcrystalline silicon layer or nanocrystalline silicon layer, and depositing a second dielectric film on the surface of the second transparent conductive oxide layer away from the P-type doped amorphous silicon layer or microcrystalline silicon layer or nanocrystalline silicon layer, and obtaining a heterojunction battery, wherein a temperature during the deposition of the first dielectric film and the second dielectric film is in a range of 25 degrees centigrade to 250 degrees centigrade.

15. The method of claim 14, wherein a method for fixing the first metal mesh and a method for fixing the second metal mesh comprises fixing via a bonding material.

16. A heterojunction battery assembly, comprising at least two heterojunction batteries of claim 1, wherein the at least two heterojunction batteries are in series connection via an adhesive conductive material, and the at least two heterojunction batteries had the same conversion efficiency.

17. The heterojunction battery assembly of claim 16, wherein the adhesive conductive material is selected from the group consisting of a conductive tape, a conducting resin, a conductive particle-containing nanometer material, and any combination thereof.

18. A heterojunction battery assembly, comprising at least two heterojunction batteries prepared by the method of claim 14, wherein the at least two heterojunction batteries are in series connection via an adhesive conductive material, and the at least two heterojunction batteries had the same conversion efficiency.

19. The heterojunction battery assembly of claim 18, wherein the adhesive conductive material is selected from the group consisting of a conductive tape, a conducting resin, a conductive particle-containing nanometer material, and any combination thereof.

* * * * *